(12) United States Patent
Ausschnitt

(10) Patent No.: US 6,766,211 B1
(45) Date of Patent: Jul. 20, 2004

(54) STRUCTURE AND METHOD FOR AMPLIFYING TARGET OVERLAY ERRORS USING THE SYNTHESIZED BEAT SIGNAL BETWEEN INTERLEAVED ARRAYS OF DIFFERING PERIODICITY

(75) Inventor: Christopher P. Ausschnitt, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 09/678,634

(22) Filed: Oct. 3, 2000

(51) Int. Cl.[7] .............................................. G06F 19/00
(52) U.S. Cl. ........................ 700/117; 700/121; 438/14
(58) Field of Search ................................ 700/117, 120, 700/121, 109–110; 438/14, 16; 356/400, 401

(56) References Cited

U.S. PATENT DOCUMENTS

| | | | | |
|---|---|---|---|---|
| 5,917,604 A | * | 6/1999 | Dirksen et al. | ............. 356/401 |
| 6,023,338 A | * | 2/2000 | Bareket | ...................... 356/401 |
| 6,061,606 A | | 5/2000 | Ross | |
| 6,161,053 A | * | 12/2000 | Chen et al. | .................. 700/121 |
| 6,462,818 B1 | * | 10/2002 | Bareket | ...................... 356/401 |
| 6,463,184 B1 | * | 10/2002 | Gould et al. | ................. 382/289 |
| 6,580,505 B1 | * | 6/2003 | Bareket | ...................... 356/401 |
| 6,625,801 B1 | * | 9/2003 | Pierrat et al. | .................. 716/19 |
| 2003/0026471 A1 | * | 2/2003 | Adel et al. | ................... 382/144 |
| 2003/0206303 A1 | * | 11/2003 | Bareket | ...................... 356/479 |

OTHER PUBLICATIONS

S. Wittekoek et al. *Phase Gratings as Waferstepper Alignment Marks for All Process Layers, Optical Mictolithography IV*, SPIE. vol. 583 (1985), pp. 24–31.

*Asymmetric Tool and Asymmetric Mark. Integrated Circuit Metrology, Inspection, and Process Control IV*, SPIE vol. 1261 (1990), pp. 150–161.

Daniel J. Coleman et al. *On the Accuracy of Overlay Measurements: Tool and Mark Asymmetry Effects. Integrated Circuit Metrology, Inspection, and Process Control IV*, SPIE vol. 1261 (1990), pp. 139–149.

* cited by examiner

Primary Examiner—Leo Picard
Assistant Examiner—Zoila Cabrera
(74) Attorney, Agent, or Firm—DeLio & Peterson LLC; Robert Curcio; Tiffany L. Townsend

(57) ABSTRACT

The amplification of target overlay errors of interleaved arrays in semiconductor fabrication is achieved by calculating the synthesized beat signal on a set of targets that are imaged using conventional microscopy and measured using a geometrical image processing algorithm. The interleaved arrays have differing periodicities resulting in a phase shift. The difference in periodicity distinguishes the arrays and amplifies the sensitivity to the overlay error. The phase-shift ensures that the elements of the arrays are interleaved and not overlapped. The beat signal has a zero crossing location that is proportional to the overlay error between the interleaved arrays, with a proportionality constant much greater than one. The overlay error is amplified by this proportionality constant.

In an alternative embodiment, the geometrical image processing algorithm is first digitally filtered prior to obtaining the overlay error. This spatial filtering allows for noise suppression. A bandpass filter algorithm is employed to eliminate all frequencies other than the fundamental spatial frequencies of the arrays from the remainder of the overlay error calculation.

30 Claims, 6 Drawing Sheets

STRUCTURE AND METHOD FOR AMPLIFYING TARGET OVERLAY ERRORS USING THE SYNTHESIZED BEAT SIGNAL BETWEEN INTERLEAVED ARRAYS OF DIFFERING PERIODICITY

BACKGROUND OF THE INVENTION

1. Field of the Invention

The present invention generally relates to a structure and method for measuring misalignments or overlay error between patterns created on a wafer during the fabrication process of an integrated circuit chip, and more specifically to measuring and controlling single nanometer alignment and overlay error components.

2. Description of Related Art

As the total alignment and overlay budget in the fabrication of advanced semiconductor circuits approach the nanometer regime, there is a concomitant need to measure and control single nanometer alignment and overlay error components. Current alignment and overlay techniques have not been shown to be adequate for the state-of-the-art small scale designs.

During the integrated circuit fabrication process, a number of patterned layers are formed on each other, typically using a photolithographic technique. The placement accuracy of each successive layer must be assessed and its precision controlled, otherwise misalignments will induce errors in the final product. The ultimate placement precision, or cumulative difference between patterns from various mask levels, is commonly referred to as "overlay error."

Prior art techniques used to measure the amount of misalignment include using alignment marks which are typically box-shaped or cross-shaped, and matching subsequent mask layer alignment marks with the alignment mark of the first layer, or using a moiré fringe technique where the alignment marks are large areas filled with a regular pattern of small lines or dots. Two major contributors to overlay misalignment are related to the failures of symmetry of the overlay measurement tool and of the mark.

Errors in overlay measurements include tool induced shift (TIS) errors attributed to the metrology tool being utilized. Errors of this kind can be traced to asymmetries of tool components, e.g., camera, illumination misalignment, residual asymmetric aberrations, and the like. Tool asymmetry leads to biased overlay estimates, even on symmetric overlay measurement marks.

Another major source of overlay errors is traceable to asymmetries in the mark structure itself. Asymmetry in the mark definition has been shown to result in overlay inaccuracies averaging in excess of 70 to 200 nm.

The instant invention overcomes the major problems associated with current overlay and alignment structures and metrology, including the following: 1) insensitivity to alignment and overlay error—Current practice measures the relative position of isolated pattern edges where only unity amplification is possible; 2) inefficient use of space—Isolated patterns used in current practice make very inefficient use of the available space, resulting in large targets and inadequate signal to noise; 3) susceptibility to noise—The isolated patterns of conventional targets result in signals that are not conducive to spatial filtering; and, 4) incompatibility with product designs—The pattern density and feature size incompatibility of conventional targets with the active chip area makes it susceptible to process anomalies that introduce measurement error (commonly referred to as wafer induced shift or WIS).

In U.S. Pat. No. 6,061,606, entitled "GEOMETRIC PHASE ANALYSIS FOR MARK ALIGNMENT," issued to Ross on May 9, 2000, a method of measuring overlay error using pairs of arrays having identical periodicity is disclosed. The spatial offset between the arrays is determined by Fourier Transform techniques. In this method, the combination of alignment arrays is digitized and Fourier Transformations are performed on the digital array pattern. Subsequent mathematical shifting and averaging is then used as a means of measuring the overlay error in two dimensions. Importantly, a Fourier Transform of the stored image of a combined alignment array must be calculated. The Fourier Transform is manipulated mathematically in order to determine the overlay error. This is achieved because information about the overlay error is represented within the Fourier Transform. While the use of arrays enables the application of Fourier Transform techniques, the use of a single periodicity limits the ability to distinguish the arrays, forcing the use of a side-by-side mark design that is inherently asymmetric and susceptible to TIS error, and constrains the sensitivity to overlay error to unity amplification. By using arrays of differing periodicity, however, the instant invention enables a symmetric interleaved mark design that greatly amplifies sensitivity to overlay error. Furthermore, the measurement of this mark does not require the complexity of Fourier analysis.

The invention described below is significantly different from the Ross invention, the moiré technique, and other conventional techniques, in that it uses a unique alignment mark combined with mathematical analysis that are not necessarily based on Fourier Transform applications to amplify the overlay error measurement.

Bearing in mind the problems and deficiencies of the prior art, it is therefore an object of the present invention to provide a method and structure for measuring the alignment error between a mask and wafer and the overlay error between a plurality of masks.

It is another object of the present invention to provide a method and structure for measuring the overlay error using a more efficient and less complex image processing algorithm.

A further object of the invention is to provide a method and structure for measuring the relative position of interleaved arrays of differing periodicity and known geometric phase-shift, and amplifying the measured sensitivity.

It is yet another object of the present invention to provide a method and structure for measuring the overlay error and simultaneously maximizing space utilization and signal-to-noise ratio.

It is another object of the present invention to provide a method and structure for measuring the overlay error while enabling both analog and digital spatial filtering for noise suppression.

A further object of the present invention is to provide a method and structure for measuring the overlay error that enables target designs that closely mimic the density and feature size of the product.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for measuring and amplifying an overlay error between masked array patterns on a wafer during semiconductor fabrication, comprising: digitizing the array patterns to form a digitized image of the array patterns; interleaving the digitized image; determining a beat signal from the digitized image; calculating a zero-crossing of the beat signal; and, deriving overlay error using a proportionality constant of the zero-crossing calculation as an amplifying factor. The array patterns comprise different geometric periodicities and are phase shifted with respect to one another. The method further comprises calculating the proportionality constant as a function of the zero crossing of the beat signal and the geometric periodicities.

In a second aspect, the instant invention is directed to a method for measuring and amplifying overlay error between array patterns in a semiconductor wafer process, each of the array patterns having a pitch and a fundamental spatial frequency, the method comprising: applying the overlays as masks in subsequent layers in the process; forming a digital image of the array patterns, the digital image having intensity information in at least two-dimensions; integrating the intensity information; calculating a reference location of the integrated intensity information; obtaining the synthetic beat frequency zero-crossing from the reference location; and, calculating and analytically amplifying the overlay error using the zero-crossing. The array patterns are two dimensional, having different geometric periodicity, and are phase shifted with respect to one another, the geometric periodicity of each of the array patterns being inversely related to the fundamental spatial frequency. The digital image may be acquired by conventional microscopy and digitally captured by an electronic camera. The integrated intensity is determined separately in each axis orientation of the two-dimensional array pattern, and summed separately along each of the axis. The zero-crossing of the synthetic beat frequency is a function of the fundamental spatial frequencies of the arrays and the overlay error, such that the zero-crossing relates to an amplification of the overlay error. The method further comprises the amplification of the overlay error expressed as a fraction having a numerator and a denominator, the numerator represented by the spatial frequency of one of the arrays, and the denominator represented by a difference between the spatial frequencies of the arrays. Also, spatial filtering may be employed on the intensity information, such that fundamental frequencies and higher order harmonics of the intensity information may be calculated and eliminated.

In a third aspect, the instant invention is directed to an apparatus for measuring overlay error on a semiconductor wafer, comprising: a first alignment array having a first periodicity and a first spatial frequency, for masking on the semiconductor wafer; a second alignment array having a second periodicity and a second spatial frequency, for masking over the first alignment array on the semiconductor wafer; a conventional microscopy system adapted to optically image the first and second arrays; an electronic camera adapted to digitize the optical image; and, a microprocessor based system adapted to receive the digitized optical image and adapted to perform mathematical manipulations on the digitized optical image, the mathematical manipulations including calculating a synthetic beat frequency zero-crossing and a proportionality constant related to the overlay error.

In a fourth aspect, the instant invention is directed to a program storage device readable by a machine, tangibly embodying a program of instructions executable by the machine to perform the method steps for calculating and amplifying overlay error between aligned array patterns during semiconductor fabrication, the method steps comprising: digitizing the array patterns to form a digitized image of the array patterns; interleaving the digitized image; calculating a phase shift from the digitized image; determining a beat signal from the digitized image; calculating a zero-crossing of the beat signal; and, amplifying the overlay error using a proportionality constant of the zero-crossing calculation as an amplifying factor.

In a fifth aspect, the instant invention is directed to a program storage device readable by a machine, tangibly embodying a program of instructions executable by the machine to perform the method steps for calculating and amplifying overlay error between aligned array patterns during a semiconductor process, each of the array patterns having a pitch and a fundamental spatial frequency, the method steps comprising: applying the overlays as two dimensional array patterns in subsequent layers in the process; forming a digital image of the array patterns, the digital image having intensity information in at least two-dimensions; integrating the intensity information; calculating a reference location of the integrated intensity information; obtaining the synthetic beat frequency zero-crossing from the reference location; and, calculating and analytically amplifying the overlay error using the zero-crossing.

In a sixth aspect, the present invention is directed to a computer program product comprising: a computer usable medium having computer readable program code means embodied therein for causing calculation and amplification of overlay error between aligned array patterns during semiconductor fabrication, the computer readable program code means in the computer program product comprising: computer readable program code means for causing a computer to effect digitizing the array patterns to form a digitized image of the array patterns; computer readable program code means for causing a computer to effect interleaving the digitized image; computer readable program code means for causing a computer to effect calculating a phase shift from the digitized image; computer readable program code means for causing a computer to effect determining a beat signal from the digitized image; computer readable program code means for causing a computer to effect calculating a zero-crossing of the beat signal; and, computer readable program code means for causing a computer to effect amplifying the overlay error using a proportionality constant of the zero-crossing calculation as an amplifying factor.

In a seventh aspect, the present invention is directed to a computer program product comprising: a computer usable medium having computer readable program code means embodied therein for causing calculation and amplification of overlay error between aligned array patterns during a semiconductor process, each of the array patterns having a pitch and a fundamental spatial frequency, the computer readable program code means in the computer program product comprising: computer readable program code means for causing a computer to effect applying the overlays as two dimensional array patterns in subsequent layers in the process; computer readable program code means for causing a computer to effect forming a digital image of the array patterns, the digital image having intensity information in at least two-dimensions; computer readable program code means for causing a computer to effect integrating the intensity information; computer readable program code means for causing a computer to effect calculating a reference location of the integrated intensity information; computer readable program code means for causing a computer to effect obtaining the synthetic beat frequency zero-crossing from the reference location; and, computer readable program code means for causing a computer to effect calculating and analytically amplifying the overlay error using the zero-crossing.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
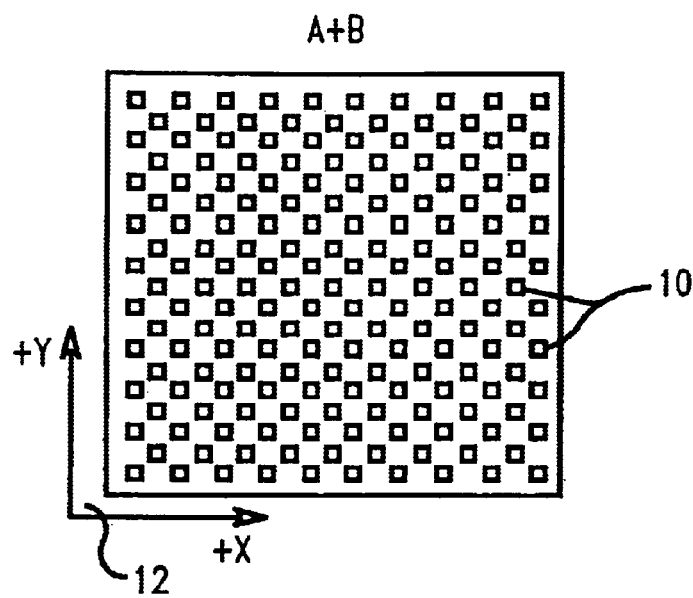
FIG. 1 is a top view of an alignment for an overlay target having two arrays (A+B) interleaved together.

In describing the preferred embodiment of the present invention, reference will be made herein to FIGS. 1–9 of the drawings in which like numerals refer to like features of the invention. Features of the invention are not necessarily shown to scale in the drawings.

The instant invention relies on a set of targets that are imaged using conventional microscopy and measured using a geometrical image processing algorithm. The image processing of the overlay target amplifies the overlay error signal. The target uses two or more arrays, e.g., array A and array B, imaged in the field of view of the metrology microscope. Importantly, these arrays have slightly different geometric periodicities, p, such that $p_A$ does not equal $p_B$, and are intentionally phase-shifted relative to one another. The difference in periodicity becomes the basis for distinguishing the arrays and amplifying the sensitivity to the overlay error. The geometric phase-shift ensures that the elements of the arrays are interleaved and not overlapped. Given the periodicities and the phase-shift, the measurable result is a beat signal whose zero crossing location is proportional to the overlay error between the two (or more) arrays, with a proportionality constant much greater than one. Thus, the overlay error is amplified by a factor which corresponds to this proportionality constant.

Figure 2:
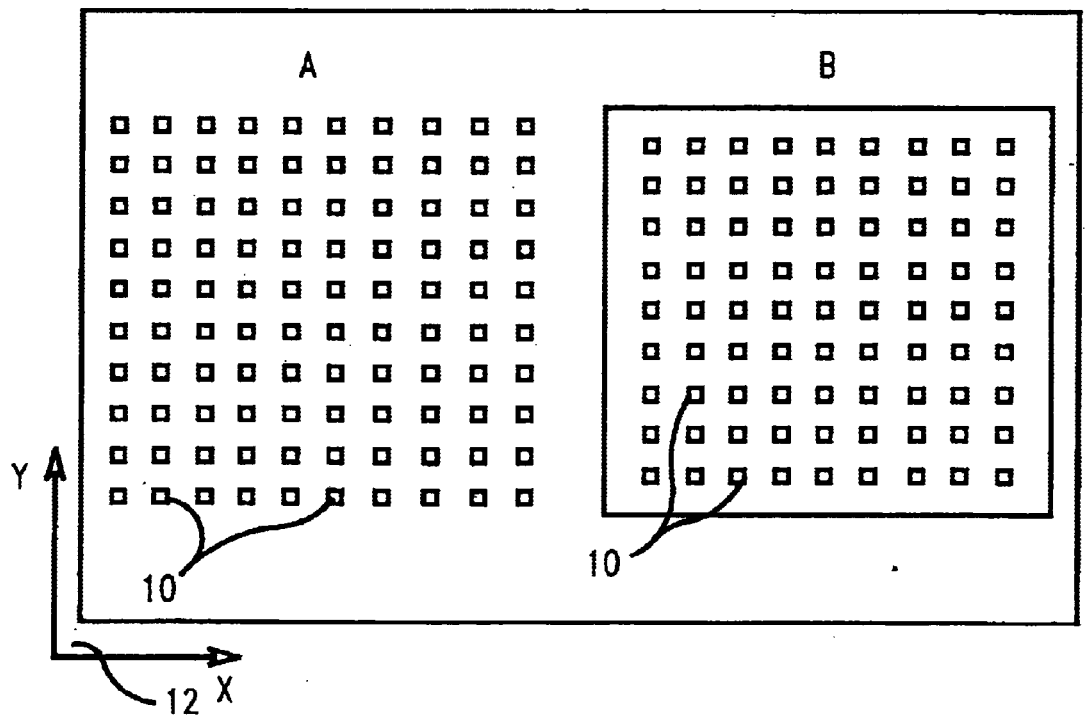
FIG. 2 is a top view of two separate overlay patterns, A and B, having different periodicities.

FIG. 1 illustrates an alignment for the overlay target of the instant invention. The pattern consists of two arrays on a wafer, or on a mask and a wafer, having differing periodicity superimposed with a relative geometric phase-shift of π and shown as array "A+B". FIG. 2 illustrates two separate overlay patterns, A and B, with different periodicities. The overlay patterns are offset from one another at a phase much greater than π, so that the A and B patterns are completely separated. In the normal overlay application, the patterns would be applied during subsequent process levels. In the normal alignment application, one pattern would be on the mask and the other on the wafer. While the array elements 10 are shown as squares (contacts or posts), they may consist of any pattern as long as the periodicities of these arrays, $p_A$ and $p_B$ (not shown), are maintained in the x and y directions, 12.

For the purpose of further describing the measurement of the combined overlay target, it is useful to consider the B-target of FIG. 2 as the reference target, and the A-target of FIG. 2 as being measured with respect to B.

Figure 3:
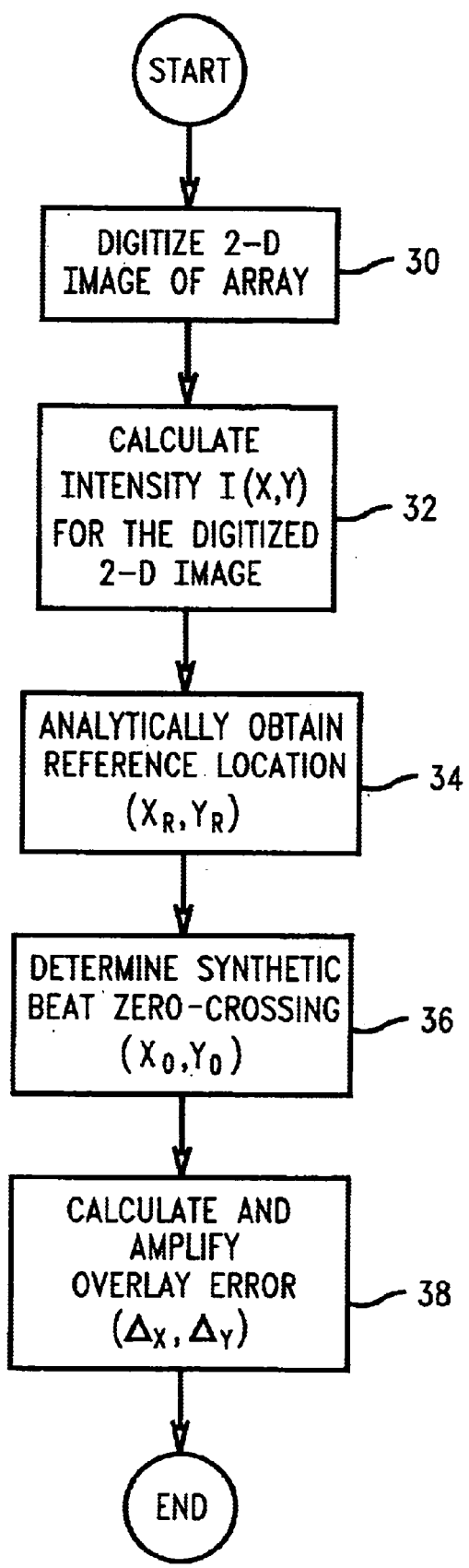
FIG. 3 is an image processing flow chart for the overlay target error calculation.
Figure 4:
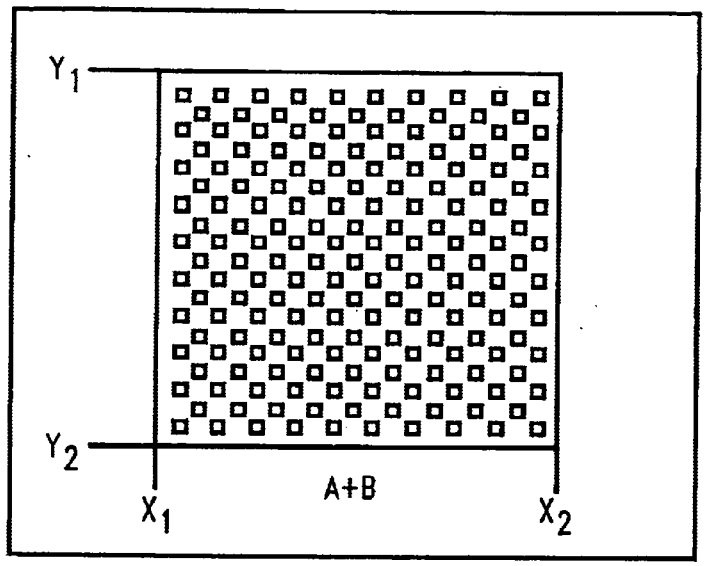
FIG. 4 defines the reference edges of the array "A+B" of FIG. 1 used to determine the target origin.

The image processing flow chart for the overlay target error calculation is shown schematically in FIG. 3. First, the image of the two-dimensional array is digitized, 30. This image may be acquired by conventional microscopy. Next, the integrated intensity for the two-dimensional digitized image I(x,y) is calculated, 32. This integrated intensity is determined separately in the X and Y orientations by summing the digitized intensity along each axis. A reference location $(X_R, Y_R)$ is then obtained, 34. The reference location is the center of the array B-target in the digitized field of view of the optical microscope, midway between the extreme edges of the surrounding array box, represented by the coordinates $X_1$, $X_2$ and $Y_1$, $Y_2$, as depicted in FIG. 4. Importantly, the reference location $(X_R, Y_R)$ establishes a target origin for the subsequent determination of overlay error:

$$(X_R, Y_R) = [(X_1+X_2)/2, (Y_1+Y_2)/2] \tag{1}$$

Once calculated, this reference location is then defined as coordinate location (0,0). The synthetic beat zero-crossing $(X_O, Y_O)$ is then determined, 36. From the zero-crossing, the overlay error (ΔX, ΔY) is calculated and analytically amplified, 38. The analytical support for this method is described as follows:

Within the A+B target shown in FIG. 1, the intensity I(x,y) of the digitized image can be expressed as a sum of sinusoids:

$$I(x,y) - I_O = A\{\cos[2\pi v_A(x-\Delta x)+\pi]+\cos[2\pi v_A(y-\Delta y)+\pi]\} + B\{\cos[2\pi v_B x]+\cos[2\pi v_B y]\} + \ldots \text{ higher order harmonics} \tag{2}$$

where, $I_O$ is the average intensity;

$v_A$ and $v_B$ are the fundamental spatial frequencies $1/p_A$ and $1/p_B$, respectively; and, (Δx, Δy) is the overlay error with respect to the origin determined by equation (1).

The sum of the sinusoids in equation (2) contains a component of the form:

$$I(x,y) \propto \cos[\pi(v_A-v_B)(x-X_O)+\pi/2]*\cos\{\pi[(v_A+v_B)(x-X_O)+2v_A X_O]+\pi/2\}$$
$$+\cos[\pi(v_A-v_B)(y-Y_O)+\pi/2]*\cos\{\pi[(v_A+v_B)(y-Y_O)+2v_A Y_O]+\pi/2\} \tag{3}$$

where, $(v_A-v_B)/2$ is the synthetic beat frequency.

The zero-crossing of this synthetic beat signal is expressed by the equation:

$$(X_O, Y_O) = [v_A/(v_A - v_B)](\Delta x, \Delta y) \quad (4)$$

As indicated by the above equation, the zero-crossing of the beat signal amplifies the overlay error by the constant factor $\beta = v_A/(v_A - v_B)$. The beat signal zero-crossing $(X_O, Y_O)$ is determined by a least-squares fit of equation (3) to the measured intensity I(x,y) where $X_O, Y_O$ are free parameters. The target is designed so that, over expected range of overlay variation, the beat signal crosses zero at a unique location $(X_O, Y_O)$ within the target.

Constraints on the target design are as follows:

1) The individual elements of the superimposed (A+B) target must be at least partially resolved by the metrology system over the entire target. In the case of an optical microscope, the minimum period $(p_{A,B})$ would be approximately 1.5 mm;

2) The overall target fits in the field of view of the metrology system and can be placed in the kerf between the chips. Maximum target size would be on the order of 50 mm; and, 3) The capture range must be sufficient to encompass the anticipated range of alignment/overlay variation. For critical process levels on current semiconductor products, the overlay tolerance is approximately ±100 nm or less.

The above criteria are relatively easy to satisfy. For example, arrays of 0.5 mm contacts, characterized by $p_B$=2.5 mm, $p_B-p_A$=50 nm, and N=10, correspond to a target that is approximately 25 mm square, with a capture range of ±250 nm and the overlay error constant factor, $\beta$, calculated to be about 50. Under these conditions, a ±2.5 nm measurement precision for the beat zero-crossing corresponds to an ability to detect ±0.05 nm alignment (overlay) variation, which is an improvement of more than an order of magnitude over the current capability in this field.

Figure 5:
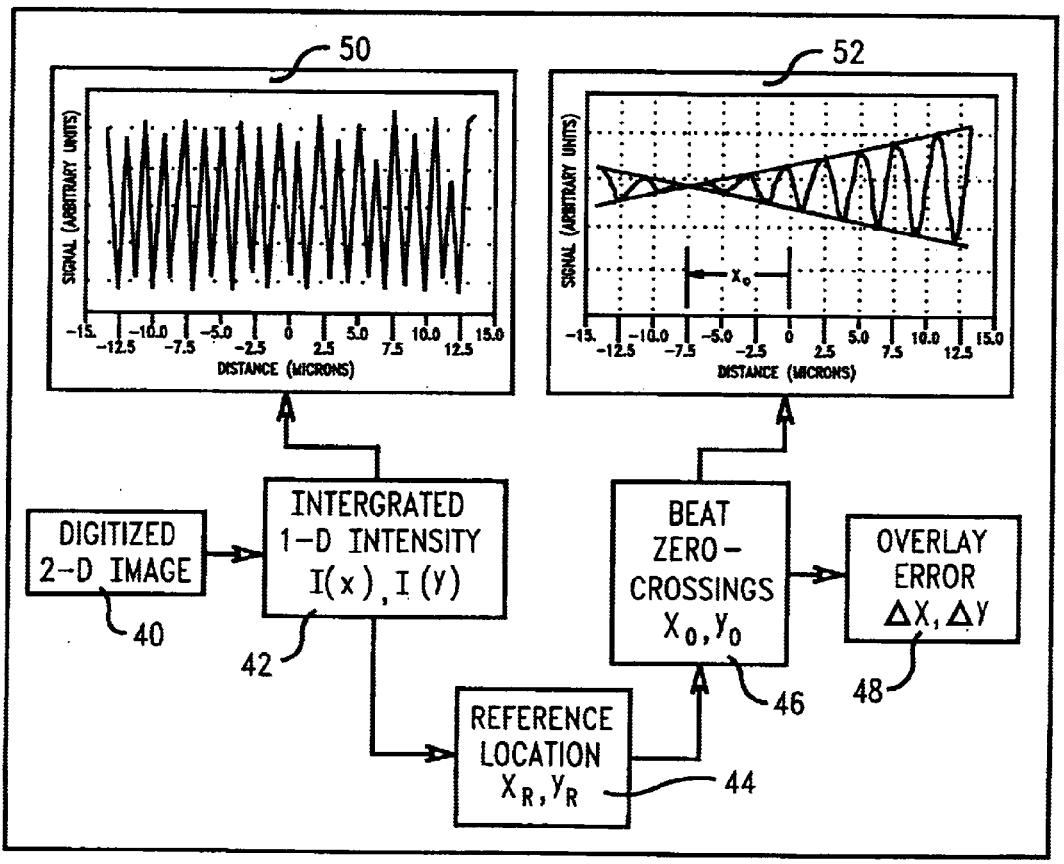
FIG. 5 depicts the process flow and resultant waveforms for an alternate image intensity calculation.

Alternatively, the image intensity I(x,y) may be separated into two one-dimensional components, I(x) and I(y), by separately integrating the digital image in the x- and y-directions, respectively. FIG. 5 depicts the process flow and resultant waveforms for this alternate image intensity calculation. Similar to the process flow of FIG. 3, this alternative process flow begins with digitizing a two-dimensional image of the target, 40. Then, the intensity in each direction is separately integrated, 42. This alternate calculation reduces the two-dimensional expansion of equation (2) to a pair of one-dimensional expansions that may be transformed in a manner analogous to equations (2)–(4) above to determine $(X_O, Y_O)$. The intensity as a function of distance is graphically shown 50 for one-dimension. The reference location 44 and beat zero-crossings 46 are then determined. The beat zero-crossing for a signal of arbitrary units is depicted 52 with the reference value $X_O$ shown in relation to the zero-crossing point. Lastly, the overlay error 48 is calculated and amplified by the constant $\beta$ from the zero-crossing calculation.

Figure 6:
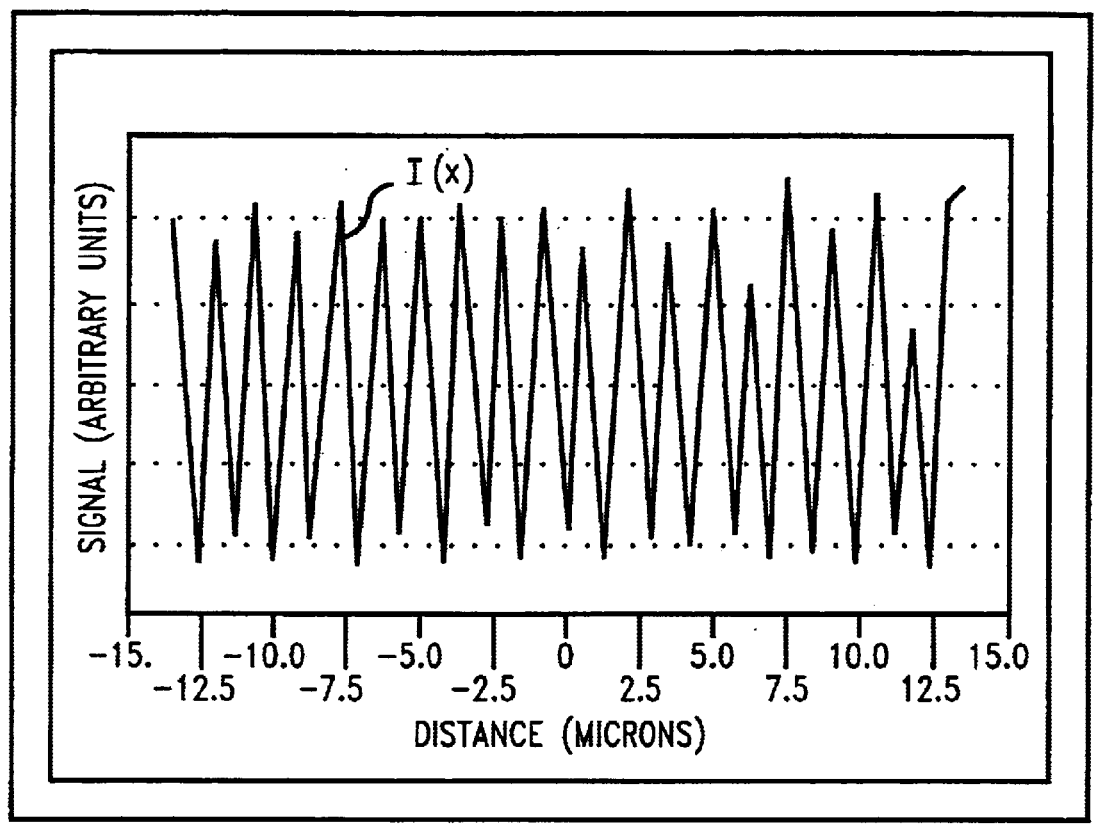
FIG. 6 depicts the integrated intensity I(x) of a target using a BioRad optical metrology system to create the digitized image of the target.
Figure 7:
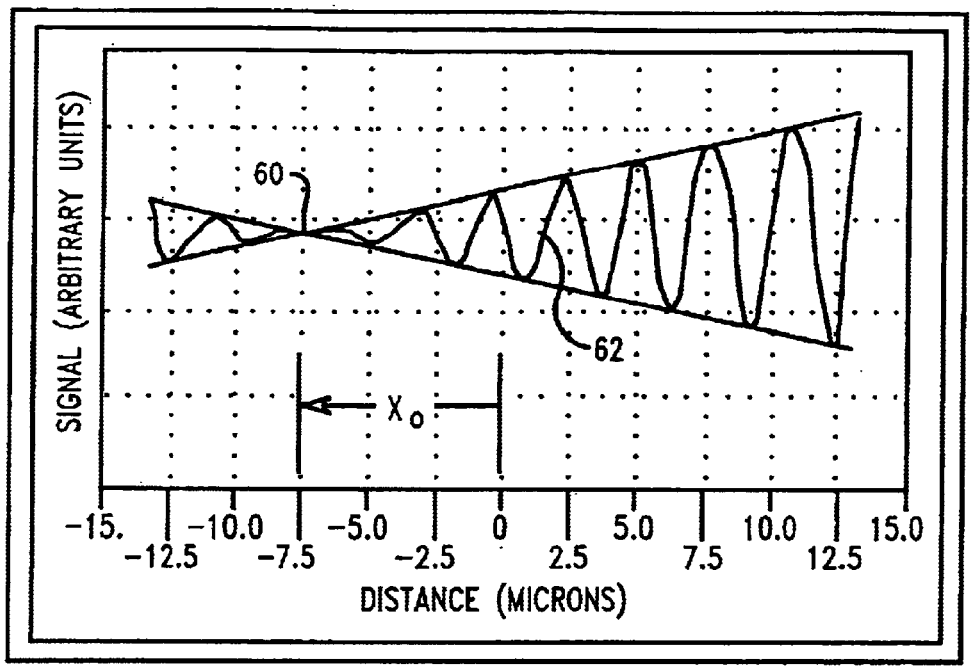
FIG. 7 is a graph of the synthetic beat signal extracted from the integrated intensity calculation of FIG. 6.

As an illustrative example, implementation of this alternate embodiment is described using a BioRad optical metrology system to create the digitized image of the target. The integrated intensity I(x) is shown in FIG. 6 for a target design characterized by: $p_B$=3 mm, $p_B-p_A$=50 nm, and N=10. The synthetic beat signal is extracted from the integrated intensity calculation of FIG. 5, and is depicted in FIG. 7. Here, the beat zero-crossing 60 for a signal of arbitrary units 62 is depicted with the reference value $X_O$ shown in relation to the zero-crossing point. For this target, $\beta$ is calculated to be 60. Consequently, the 7.5 μm shift of the beat zero crossing shown in FIG. 7 corresponds to an overlay error of 125 nm (7.5×10$^{-6}$/60). The 7.5 μm shift is an amplification of the overlay error.

Figure 8:
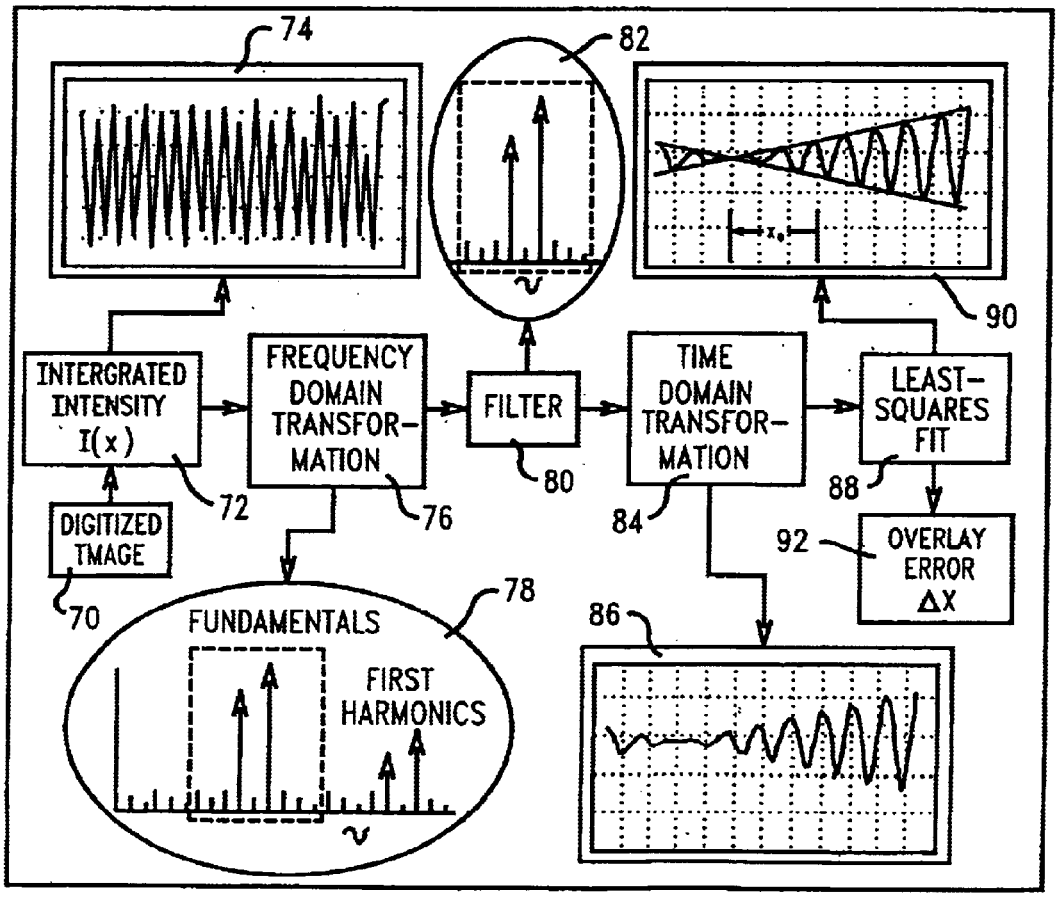
FIG. 8 depicts the process flow and resultant waveforms with an additional spatial filtering step in the signal processing.

In another embodiment, noise in the determination of $(X_O, Y_O)$ can be suppressed by the addition of a spatial filtering step in this signal processing technique as depicted in FIG. 8. The digitized image is obtained from conventional means 70, as performed in the earlier embodiments. The one-dimensional integrated intensity I(x) is determined 72, and illustrated as a function of distance about the target 74. A frequency domain calculation 76 reveals the fundamental frequencies and first order harmonics of the intensity spectrum 78. Next, a filter algorithm is employed 80; here, shown to eliminate the first order harmonics from the remainder of the calculation, 82. The narrow band filter selects only the fundamental spatial frequencies of the digitized image that are predetermined by the periodicities of the target design, resulting in a synthesized beat signal. Both high and low frequency noise contributions are suppressed. The frequency domain information is then transformed back to the time domain 84, and shown graphically as a function of distance, 86. The beat zero-crossing is then easily determined by a least-squares fit on the time-domain data 88, acting on the equal-amplitude component of the two spatial frequencies. This includes determining the zero-crossing point and $X_O$ coordinate, 90. Lastly, the one-dimensional overlay error, $\Delta x$, is then calculated 92 from the amplified zero-crossing value.

Figure 9:
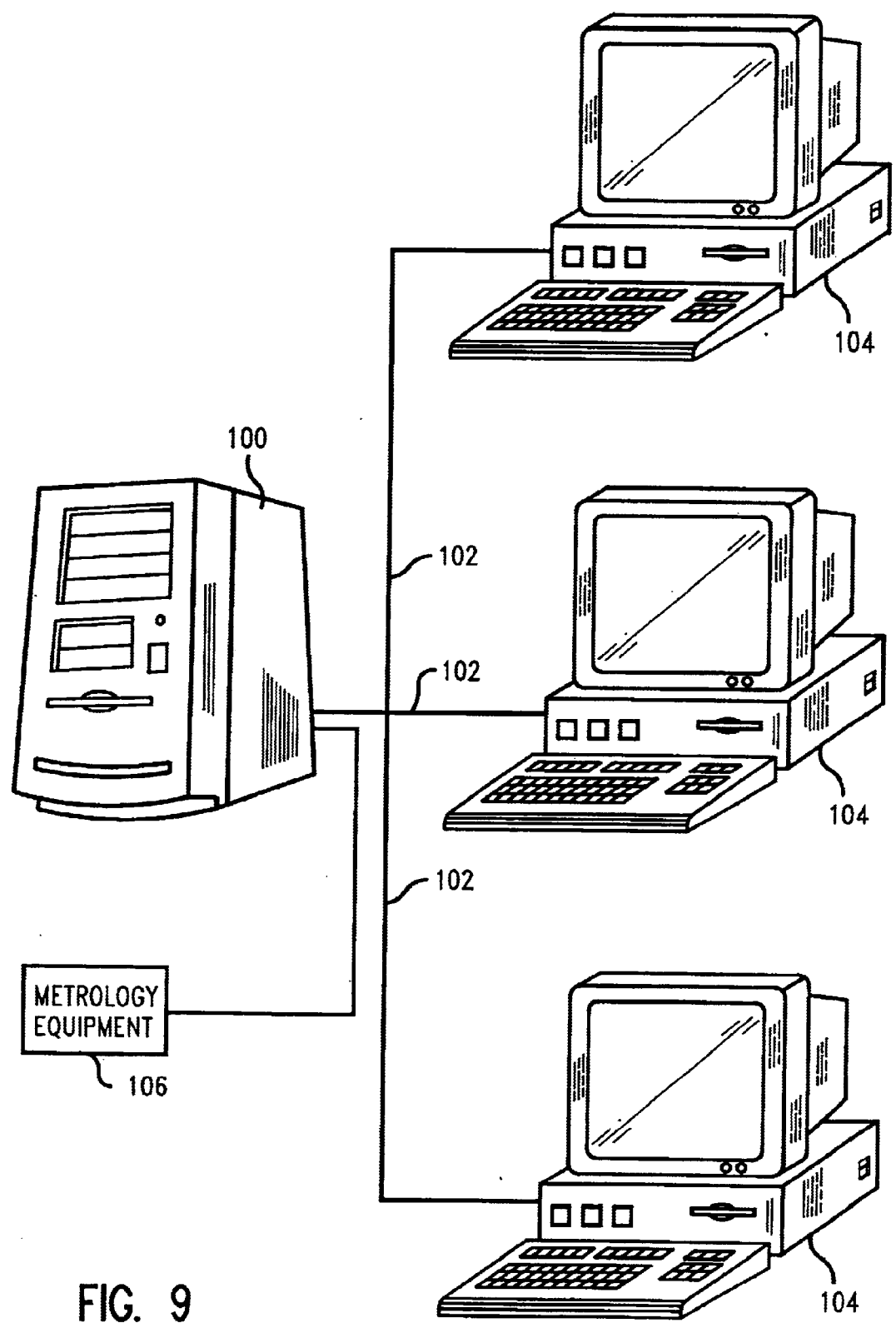
FIG. 9 depicts a system of hardware and software representing the necessary environment for practicing the embodiments of the present invention.

A system of hardware and software representing the necessary environment for practicing the embodiments of the present invention is depicted in FIG. 9. A computer system having at least central processing unit 100 is interconnected via electrical bus lines 102 to an interactive display terminal(s) 104. This computer system may be directly hardwired to the metrology equipment 106, or adapted to receive the digitized data from the metrology equipment placed on a memory storage device such as a CD ROM (not shown), or the like, for subsequent analyses and calculations. The CD ROM may be inserted within the interactive display terminal 104 or the computer 100 itself.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for measuring and amplifying an overlay error between masked array patterns on a wafer during semiconductor fabrication, comprising:
   digitizing said array patterns to form a digitized image of said array patterns;
   interleaving said digitized image;
   determining a beat signal from said digitized image;
   calculating a zero-crossing of said beat signal; and,
   deriving overlay error using a proportionality constant of said zero-crossing calculation as an amplifying factor.

2. The method of claim 1 wherein said array patterns comprise different geometric periodicities and are phase shifted with respect to one another.

3. The method of claim 2 wherein said interleaving step further comprises retaining said phase shift between said digitized images.

4. The method of claim 2 further comprising calculating said proportionality constant as a function of said zero crossing of said beat signal and said geometric periodicities.

5. A method for measuring and amplifying overlay error between array patterns in a semiconductor wafer process, each of said array patterns having a pitch and a fundamental spatial frequency, said method comprising:
   applying said overlays as masks in subsequent layers in said process;
   forming a digital image of said array patterns, said digital image having intensity information in at least two-dimensions;
   integrating said intensity information;
   calculating a reference location of said integrated intensity information;
   obtaining the synthetic beat frequency zero-crossing from said reference location; and,
   calculating and analytically amplifying said overlay error using said zero-crossing.

6. The method of claim 5 wherein said array patterns are two dimensional, having different geometric periodicity, and are phase shifted with respect to one another, said geometric periodicity of each of said array patterns being inversely related to said fundamental spatial frequency.

7. The method of claim 5 wherein said digital image is acquired by conventional microscopy and digitally captured by an electronic camera.

8. The method of claim 5 wherein said integrated intensity is determined separately in each axis orientation of said two-dimensional array pattern, and summed separately along each of said axis.

9. The method of claim 5 wherein said reference location is the center of one of said arrays in said digital image.

10. The method of claim 9 wherein said center is located midway between the extreme edges of said one of said arrays, such that said center establishes a target origin for subsequent determination of said overlay error.

11. The method of claim 5 wherein said zero-crossing of said synthetic beat frequency is a function of said fundamental spatial frequencies of said arrays and said overlay error, such that said zero-crossing relates to an amplification of said overlay error.

12. The method of claim 11 further comprising said amplification of said overlay error expressed as a fraction having a numerator and a denominator, said numerator represented by said spatial frequency of one of said arrays, and said denominator represented by a difference between said spatial frequencies of said arrays.

13. The method of claim 5 wherein said beat signal zero-crossing is determined by a least-squares fit to said integrated intensity.

14. The method of claim 5 further comprising performing spatial filtering on said intensity information.

15. The method of claim 14 wherein said intensity information is obtained separately for each dimension.

16. The method of claim 15 further comprising calculating fundamental frequencies and higher order harmonics of said intensity information, and eliminating said higher order harmonics from said intensity information.

17. An apparatus for measuring overlay error on a semiconductor wafer, comprising:
   a first alignment array having a first periodicity and a first spatial frequency, for masking on said semiconductor wafer;
   a second alignment array having a second periodicity and a second spatial frequency, for masking over said first alignment array on said semiconductor wafer;
   a conventional microscopy system adapted to optically image said first and second arrays;
   an electronic camera adapted to digitize said optical image; and,
   a microprocessor based system adapted to receive said digitized optical image and adapted to perform mathematical manipulations on said digitized optical image, said mathematical manipulations including calculating a synthetic beat frequency zero-crossing and a proportionality constant related to said overlay error.

18. A program storage device readable by a machine, tangibly embodying a program of instructions executable by the machine to perform the method steps for calculating and amplifying overlay error between aligned array patterns during semiconductor fabrication, said method steps comprising:
   digitizing said array patterns to form a digitized image of said array patterns;
   interleaving said digitized image;
   calculating a phase shift from said digitized image;
   determining a beat signal from said digitized image;
   calculating a zero-crossing of said beat signal; and,
   amplifying said overlay error using a proportionality constant of said zero-crossing calculation as an amplifying factor.

19. The program storage device of claim 18 further comprising performing calculating said proportionality constant as a function of said zero crossing of said beat signal and geometric periodicities of said array patterns.

20. A program storage device readable by a machine, tangibly embodying a program of instructions executable by the machine to perform the method steps for calculating and amplifying overlay error between aligned array patterns during a semiconductor process, each of said array patterns having a pitch and a fundamental spatial frequency, said method steps comprising:
   applying said overlays as two dimensional array patterns in subsequent layers in said process;
   forming a digital image of said array patterns, said digital image having intensity information in at least two-dimensions;
   integrating said intensity information;
   calculating a reference location of said integrated intensity information;
   obtaining the synthetic beat frequency zero-crossing from said reference location; and,
   calculating and analytically amplifying said overlay error using said zero-crossing.

21. The program storage device of claim 20 further comprising determining said integrated intensity separately in each axis orientation of said two-dimensional array patterns, and summed separately along each of said axis.

22. The program storage device of claim 20 further comprising locating said center midway between the extreme edges of one of said arrays, such that said center establishes a target origin for subsequent determination of said overlay error.

23. The program storage device of claim 20 further comprising calculating said zero-crossing of said synthetic beat frequency as a function of said fundamental spatial frequencies of said arrays and said overlay error, such that said zero-crossing relates to an amplification of said overlay error.

24. The program storage device of claim 20 further comprising calculating fundamental frequencies and higher order harmonics of said intensity information, and eliminating said higher order harmonics from said intensity information.

25. A computer program product comprising:

a computer usable medium having computer readable program code means embodied therein for causing calculation and amplification of overlay error between aligned array patterns during semiconductor fabrication, the computer readable program code means in said computer program product comprising:

computer readable program code means for causing a computer to effect digitizing said array patterns to form a digitized image of said array patterns;

computer readable program code means for causing a computer to effect interleaving said digitized image;

computer readable program code means for causing a computer to effect calculating a phase shift from said digitized image;

computer readable program code means for causing a computer to effect determining a beat signal from said digitized image;

computer readable program code means for causing a computer to effect calculating a zero-crossing of said beat signal; and, computer readable program code means for causing a computer to effect amplifying said overlay error using a proportionality constant of said zero-crossing calculation as an amplifying factor.

26. The computer program product of claim 25 further comprising computer readable program code means for causing a computer to effect performing calculating said proportionality constant as a function of said zero crossing of said beat signal and geometric periodicities of said array patterns.

27. A computer program product comprising:

a computer usable medium having computer readable program code means embodied therein for causing calculation and amplification of overlay error between aligned array patterns during a semiconductor process, each of said array patterns having a pitch and a fundamental spatial frequency, the computer readable program code means in said computer program product comprising:

computer readable program code means for causing a computer to effect applying said overlays as two dimensional array patterns in subsequent layers in said process;

computer readable program code means for causing a computer to effect forming a digital image of said array patterns, said digital image having intensity information in at least two-dimensions;

computer readable program code means for causing a computer to effect integrating said intensity information;

computer readable program code means for causing a computer to effect calculating a reference location of said integrated intensity information;

computer readable program code means for causing a computer to effect obtaining the synthetic beat frequency zero-crossing from said reference location; and, computer readable program code means for causing a computer to effect calculating and analytically amplifying said overlay error using said zero-crossing.

28. The computer program product of claim 27 further comprising computer readable program code means for causing a computer to effect determining said integrated intensity separately in each axis orientation of said two-dimensional array patterns, and summed separately along each of said axis.

29. The computer program product of claim 27 further comprising computer readable program code means for causing a computer to effect locating said center midway between the extreme edges of one of said arrays, such that said center establishes a target origin for subsequent determination of said overlay error.

30. The computer program product of claim 27 further comprising computer readable program code means for causing a computer to effect calculating said zero-crossing of said synthetic beat frequency as a function of said fundamental spatial frequencies of said arrays and said overlay error, such that said zero-crossing relates to an amplification of said overlay error.

* * * * *